(12) United States Patent
Yousefpor et al.

(10) Patent No.: US 8,810,537 B2
(45) Date of Patent: Aug. 19, 2014

(54) QUADRATURE DEMODULATION FOR TOUCH SENSITIVE DEVICES

(75) Inventors: Marduke Yousefpor, San Jose, CA (US); Kevin J. White, Los Gatos, CA (US); Christoph Horst Krah, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 395 days.

(21) Appl. No.: 13/397,643

(22) Filed: Feb. 15, 2012

(65) Prior Publication Data

US 2013/0207906 A1 Aug. 15, 2013

(51) Int. Cl.
   *G06F 3/041* (2006.01)
   *H03D 1/22* (2006.01)
   *H03H 11/20* (2006.01)

(52) U.S. Cl.
   CPC ...... *G06F 3/0418* (2013.01); *H03D 2200/0029* (2013.01)
   USPC ............................ 345/173; 329/304; 327/238

(58) Field of Classification Search
   CPC ..... G06F 3/0488; G06F 3/041; G06F 3/0416; G06F 3/0418; G06F 3/044; H03D 3/007; H03D 1/2245; H03D 2200/0029; H03D 2200/0082; H03H 11/20; H03H 11/22
   USPC ............. 345/173, 174; 340/407.1; 178/18.01, 178/18.06; 329/304; 327/231, 233, 237, 327/238, 243, 254
   See application file for complete search history.

(56) References Cited

U.S. PATENT DOCUMENTS

| | | | |
|---|---|---|---|
| 4,475,088 A * | 10/1984 | Beard ............................. | 331/25 |
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,400,200 B2 * | 6/2002 | Sasaki .............................. | 327/244 |
| 6,690,387 B2 | 2/2004 | Zimmerman et al. | |
| 7,015,894 B2 | 3/2006 | Morohoshi | |

(Continued)

FOREIGN PATENT DOCUMENTS

| | | |
|---|---|---|
| JP | 2000-163031 A | 6/2000 |
| JP | 2002-342033 A | 11/2002 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

(Continued)

*Primary Examiner* — Ryan Johnson
(74) *Attorney, Agent, or Firm* — Morrison & Foerster LLP

(57) ABSTRACT

Demodulation circuits and processes for demodulating touch signals from a touch sensor using the demodulation circuits are provided. The demodulation circuits can include circuitry configured to determine an adjustable phase delay based at least in part on a quadrature component of the touch signal or the phase-adjusted touch signal. The demodulation circuit can further include circuitry for applying the adjustable phase delay to the touch signal to compensate for phase delays in the touch signal caused by the touch sensor and/or other components. The demodulation circuit can dynamically change the adjustable phase delay to compensate for time-varying phase delays caused by the touch sensor and/or other components.

25 Claims, 14 Drawing Sheets

(56) References Cited

U.S. PATENT DOCUMENTS

| | | |
|---|---|---|
| 7,184,064 B2 | 2/2007 | Zimmerman et al. |
| 7,298,222 B2 | 11/2007 | Rosik et al. |
| 7,606,332 B2 | 10/2009 | Isaac et al. |
| 7,663,607 B2 | 2/2010 | Hotelling et al. |
| 7,956,850 B2 * | 6/2011 | Moon et al. .................. 345/173 |
| 8,020,026 B1 | 9/2011 | Khlat et al. |
| 8,493,360 B2 * | 7/2013 | Kremin et al. ................ 345/174 |
| 2006/0026521 A1 | 2/2006 | Hotelling et al. |
| 2006/0197753 A1 | 9/2006 | Hotelling |
| 2010/0059295 A1 * | 3/2010 | Hotelling et al. .......... 178/18.06 |

OTHER PUBLICATIONS

Rubine, D.H. (May 1992). "Combining Gestures and Direct Manipulation," CHI ' 92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner personal device 1400 personal device 1300

QUADRATURE DEMODULATION FOR TOUCH SENSITIVE DEVICES

FIELD

This relates generally to touch sensitive devices and, more specifically, to demodulation circuits for touch sensitive devices.

BACKGROUND

Touch sensitive devices have become popular as input devices to computing systems due to their ease and versatility of operation as well as their declining price. A touch sensitive device can include a touch sensor panel, which can be a clear panel with a touch sensitive surface, and a display device such as a liquid crystal display (LCD) that can be positioned partially or fully behind the panel or integrated with the panel so that the touch sensitive surface can cover at least a portion of the viewable area of the display device. The touch sensitive device can allow a user to perform various functions by touching the touch sensor panel using a finger, stylus or other object at a location often dictated by a user interface (UI) being displayed by the display device. In general, the touch sensitive device can recognize a touch event and the position of the touch event on the touch sensor panel, and the computing system can then interpret the touch event in accordance with the display appearing at the time of the touch event, and thereafter can perform one or more actions based on the touch event.

One type of touch sensor panel that can be used is a capacitive touch sensor panel. Capacitive touch sensor panels can by driven by stimulation signals and can output touch signals representative of touch events detected on the surface of the panel. In order to obtain accurate touch detection, it is important that the touch sensor panel output strong touch signals. However, the touch sensor panel and other components within a touch sensitive device can cause phase delays in the touch signals, resulting in weaker outputs. These phase delays can be due at least in part to signal transmission and/or processing delays in the panel and other components. Conventional touch sensors account for these phase delays by hard-wiring a phase adjustment, with the adjustment amount being based on an average expected phase delay. While this may reduce the effects of the phase delays caused by the touch sensor panel and other components, it does not account for the variation in phase delays that can be present in different touch sensor panels (e.g., due to manufacturing tolerances) and changes in phase delay over time (e.g., due to environmental factors

SUMMARY

Demodulation circuits for demodulating touch signals from a touch sensor are disclosed. The demodulation circuits can include circuitry configured to determine an adjustable phase delay for a touch signal based at least in part on a quadrature component of the touch signal or the phase-adjusted touch signal. The demodulation circuit can further include circuitry for applying the adjustable phase delay to the touch signal to compensate for phase delays in the touch signal caused by the touch sensor and/or other components. The demodulation circuit can dynamically change the adjustable phase delay to compensate for time-varying phase delays caused by the touch sensor and/or other components. Processes for demodulating touch signals from a touch sensor are also disclosed.

DETAILED DESCRIPTION

In the following description of example embodiments, reference is made to the accompanying drawings in which it is shown by way of illustration specific embodiments that can be practiced. It is to be understood that other embodiments can be used and structural changes can be made without departing from the scope of the various embodiments.

This relates to demodulation circuits and processes for demodulating touch signals from a touch sensor using the demodulation circuits. The demodulation circuits can include circuitry configured to determine an adjustable phase delay in a touch signal based at least in part on a quadrature component of the touch signal or the phase-adjusted touch signal. The demodulation circuit can further include circuitry for applying the adjustable phase delay to the touch signal to compensate for phase delays in the touch signal caused by the touch sensor and/or other components. The demodulation circuit can dynamically change the adjustable phase delay to compensate for time-varying phase delays caused by the touch sensor and/or other components. These will be described in more detail below.

Figure 1:
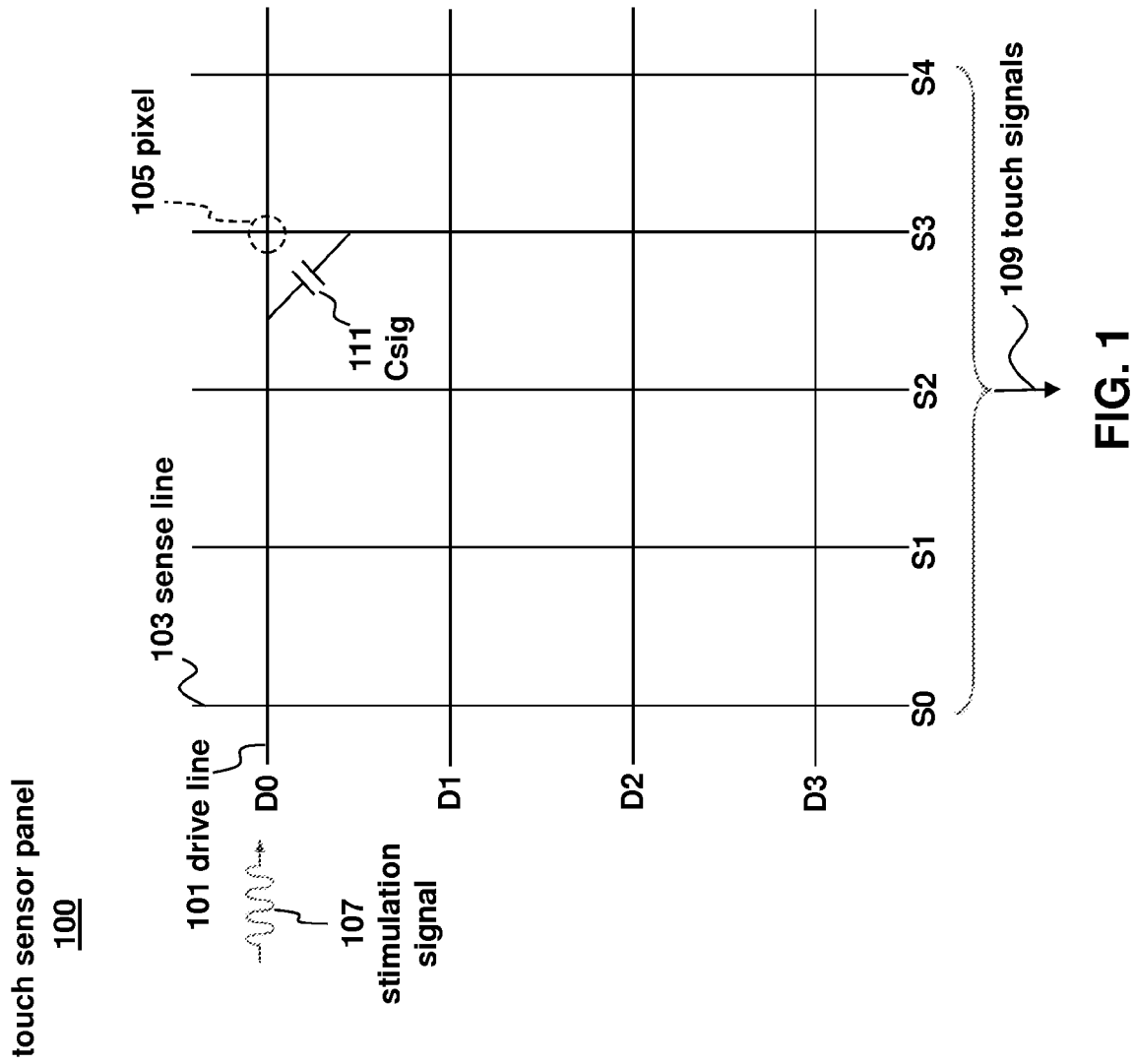
FIG. 1 illustrates an exemplary touch sensor panel that can be used with a demodulation circuit according to various embodiments.

FIG. 1 illustrates touch sensor panel 100 that can be used to detect touch events on a touch sensitive device, such as a mobile phone, tablet, touchpad, portable computer, portable media player, or the like. Touch sensor panel 100 can include an array of pixels 105 that can be formed at the crossing points between rows of drive lines 101 (D0-D3) and columns of sense lines 103 (S0-S4). Each pixel 105 can have an associated mutual capacitance Csig 111 formed between the crossing drive lines 101 and sense lines 103 when the drive lines are stimulated. The drive lines 101 can be stimulated by stimulation signals 107 provided by drive circuitry (not shown) and can include an alternating current (AC) waveform. The sense lines 103 can transmit touch signals 109 indicative of a touch at the panel 100 to sense circuitry (not shown), which can include a sense amplifier for each sense line.

To sense a touch at the touch sensor panel 100, drive lines 101 can be stimulated by the stimulation signals 107 to capacitively couple with the crossing sense lines 103, thereby forming a capacitive path for coupling charge from the drive lines 101 to the sense lines 103. The crossing sense lines 103 can output touch signals 109, representing the coupled charge or current. When a user's finger (or other object) touches the panel 100, the finger can cause the capacitance Csig 111 to reduce by an amount ΔCsig at the touch location. This capacitance change ΔCsig can be caused by charge or current from the stimulated drive line 101 being shunted through the touching finger to ground rather than being coupled to the crossing sense line 103 at the touch location. The touch signals 109 representative of the capacitance change ΔCsig can be transmitted by the sense lines 103 to the sense circuitry for processing. The touch signals 109 can indicate the pixel where the touch occurred and the amount of touch that occurred at that pixel location.

While the embodiment shown in FIG. 1 includes four drive lines 101 and five sense lines 103, it should be appreciated that touch sensor panel 100 can include any number of drive lines 101 and any number of sense lines 103 to form the desired number and pattern of pixels 105. Additionally, while the drive lines 101 and sense lines 103 are shown in FIG. 1 in a crossing configuration, it should be appreciated that other configurations are also possible to form the desired pixel pattern. While FIG. 1 illustrates mutual capacitance touch sensing, other touch sensing technologies may also be used in conjunction with embodiments of the disclosure, such as self-capacitance touch sensing, resistive touch sensing, projection scan touch sensing, and the like. Furthermore, while various embodiments describe a sensed touch, it should be appreciated that the touch sensor panel 100 can also sense a hovering object and generate hover signals therefrom.

As mentioned above, touch sensor panel 100, along with other components within a device, can cause phase delays in touch signals 109. Thus, demodulation circuits, such as those described below with respect to FIGS. 2-11, can be coupled to each sense line 103 (S0-S4) to compensate for these phase delays.

Figure 2:
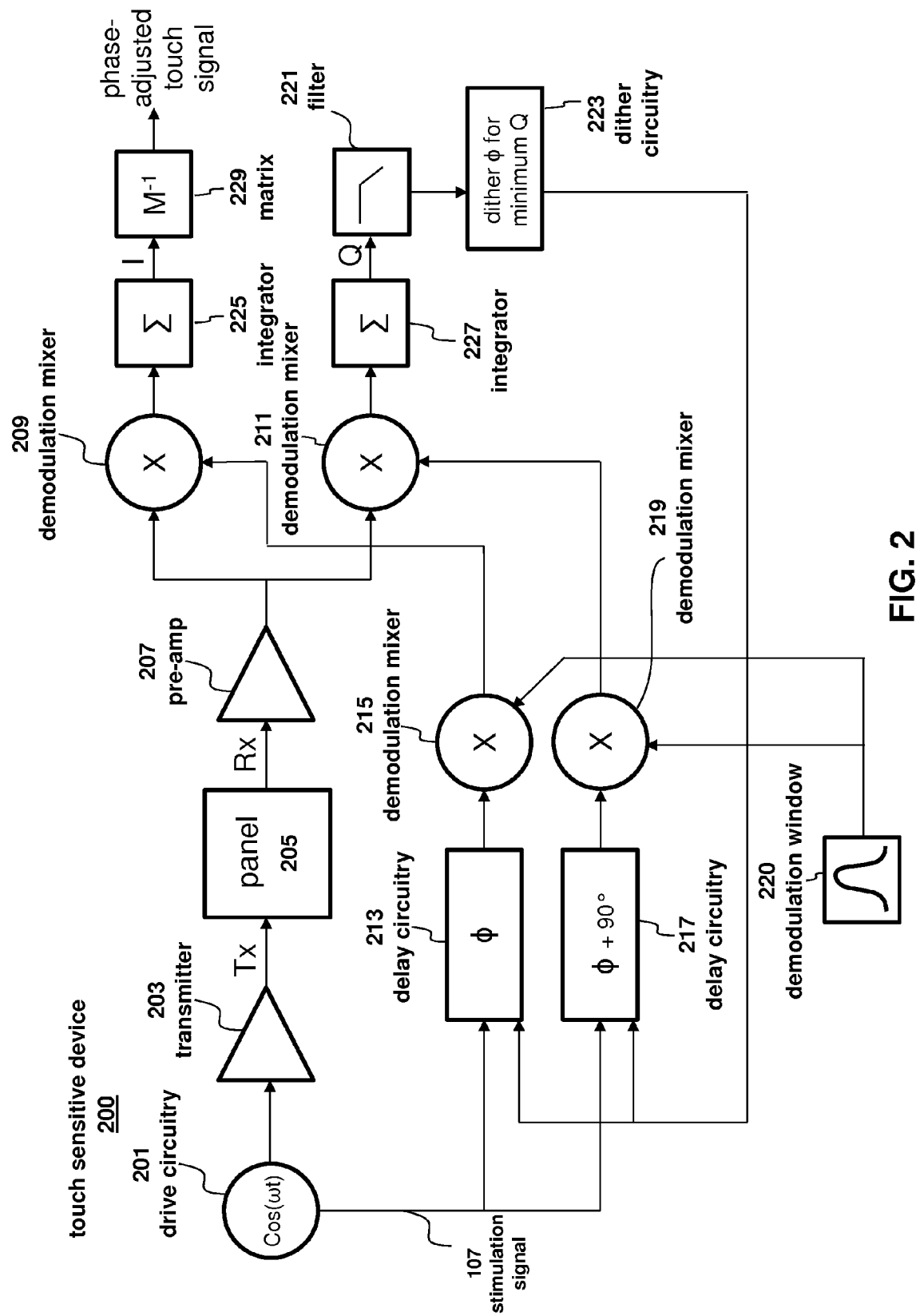
FIG. 2 illustrates a functional diagram of an exemplary demodulation circuit according to various embodiments.

FIG. 2 illustrates a functional diagram of an exemplary touch sensitive device having a demodulation circuit to compensate for phase delays in touch signals. Device 200 can include drive circuitry 201 for generating a stimulation signal, such as stimulation signal 107. The output of drive circuitry 201 can be transmitted to an input buffer, such as transmitter 203, before being sent to panel 205. Device 200 can also include panel 205, which can be a touch sensitive panel similar or identical to touch sensor panel 100. Touch panel 205 can output touch signals similar or identical to touch signals 109 in response to the stimulation signal. The touch signals output by panel 205 can be transmitted to an amplifier, such as pre-amp 207. The output of pre-amp 207 can be transmitted to demodulation mixers 209 and 211.

Device 200 can further include a demodulation circuit to determine an adjustable phase delay and to apply the adjustable phase delay to the touch signals. The demodulation circuit can include delay circuitry 213 configured to receive the stimulation signal from drive circuitry 201 and cause a phase delay of $\phi$ in the stimulation signal. The output of delay circuitry 213 can be transmitted to demodulation mixer 215, where it can be combined with demodulation envelope window 220. Demodulation envelope window 220 can be a low or band-pass filter, such as a Chebyschev filter. The output of demodulation mixer 215 can be transmitted to demodulation mixer 209, where it can be combined with the touch signal output by pre-amp 207 to compensate for the phase delay in the touch signal.

The demodulation circuit can further include delay circuitry 217 configured to receive the stimulation signal from drive circuitry 201 and cause a phase delay of $(\phi+90°)$ in the stimulation signal. The output of delay circuitry 217 can be transmitted to demodulation mixer 219, where it can be combined with demodulation envelope window 220. The output of demodulation mixer 219 can be transmitted to demodulation mixer 211, where it can be combined with the touch signal output of pre-amp 207 to determine the adjustable phase delay to be applied by delay circuitry 213 and 217.

The demodulation circuit can further include integrators 225 and 227 coupled to the outputs of demodulation mixers 209 and 211, respectively. Integrators 225 and 227 can integrate the output of demodulation mixers 209 and 211 over time. The output of integrator 225 can be the phase-adjusted in-phase (I-phase) component of the touch signal output by panel 205 and the output of integrator 227 can be the quadrature (Q) component of the phase-adjusted touch signal output by panel 205. The I-phase component can be transmitted to matrix 229 where the signal can be multiplied by a matrix to generate a phase-adjusted touch signal representing a touch event detected by the sense line of panel 205 that is coupled to the demodulation circuit. In some embodiments, matrix 229 can be an inverse of a matrix having a gain greater than one that is similar or identical to that described in U.S. patent Ser. No. 12/208,329, entitled "Multiple Stimulation Phase Determination." Specifically, each row of the matrix can represent a single step among multiple steps needed to compute values for generating an image of touch. Each column of the matrix can represent a drive line of touch sensor panel 205 to be stimulated. Each element of the matrix can represent the phase of stimulation signal 107 to be applied to a particular drive line in a particular step.

To determine the phase delay $\phi$ that is to be applied by delay circuitry 213 and 217 to the stimulation signal from drive circuitry 201, the demodulation circuit can further include filter 221 and dither circuitry 223. Filter 221 can be configured to receive the Q-component of the phase-adjusted touch signal that is output by integrator 227. In some embodiments, filter 221 can be a low pass filter with a bandwidth below 60 Hz. In other embodiments, other bandwidths can be used. The output of filter 221 can be transmitted to dither circuitry 223. Dither circuitry 223 can be configured to dither the value of $\phi$ to produce a reduced or minimum value of the Q-component of the signal. For example, in one embodiment, a digital implementation in which delays are generated by shifting a digital representation of the reference stimulation signal 107 using a parallel bit shift register can be used. The dither in $\phi$ can be a shift in time (degree phase shift/stimulation frequency) that is introduced to perturb the filtered Q (output by filter 221) to determine whether or not Q is at its minimum value. The output of dither circuitry 223 can be transmitted to delay circuitry 213 and 217. Since the phase delay φ that causes the Q-component to be at its minimum value corresponds to the phase delay φ that causes the I-phase component to be at its maximum value, dither circuitry 223 can be used to improve the signal strength of the touch signal output by matrix 229. In this way, dither circuitry 223 can dynamically adjust the phase delay applied to the Q and I-phase components of the touch signal to compensate for non-constant phase delays caused by circuitry located between drive circuitry 201 and the outputs of integrators 225 and 227, thereby improving the signal strength of the touch signal output by matrix 229.

In some embodiments, filter 221 and dither circuitry 223 can be used to adjust the value of φ only when no touch events are occurring at panel 205. In these embodiments, when touch events are occurring at panel 205, φ can be held constant at the most recently determined value of φ.

In some embodiments, filter 221 and dither circuitry 223 can be implemented in an ARM processor or other processor since the functions performed by these elements do not need to be performed with a high frequency. The remaining components (excluding panel 205), can be implemented in an application specific integrated circuit (ASIC) since the functions performed by these elements relate to the sensing of touch events on panel 205 and can be performed at a higher frequency. In other embodiments, all components of device 200 (excluding panel 205) can be implemented in an ASIC.

It should be appreciated that FIG. 2 (and FIGS. 3-10) is a functional diagram of the demodulation circuit of touch sensitive device 200. The actual components used to implement the demodulation circuit can vary and one of ordinary skill, given the functional diagram, can select known circuit elements to implement the demodulation circuit.

Figure 3:
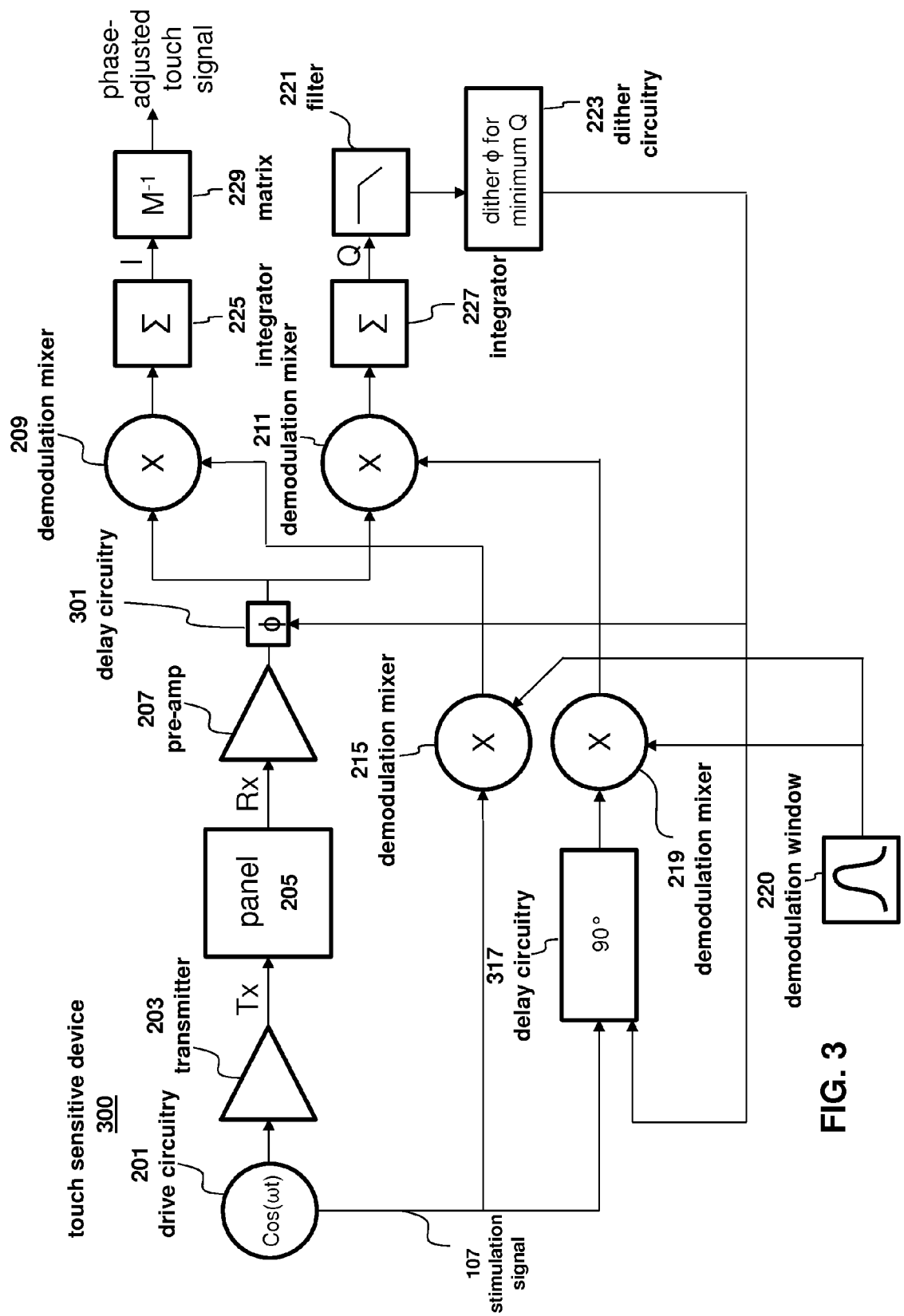
FIG. 3 illustrates a functional diagram of another exemplary demodulation circuit according to various embodiments.

FIG. 3 illustrates a functional diagram of an exemplary touch sensitive device 300 having a demodulation circuit. The demodulation circuit of device 300 is similar to that of device 200, except that the phase delay φ can be introduced into the touch signal at the output of pre-amp 207 by delay circuitry 301 rather than into the stimulation signal by delay circuitry 213 and 217. Delay circuitry 301 can be similar or identical to delay circuitry 213. Since phase delay φ can be introduced into the output of pre-amp 207 rather than into the stimulation signal output by drive circuitry 201, delay circuitry 213 can be removed and delay circuitry 317, which can be configured to cause a phase delay of 90°, can be used in place of delay circuitry 217.

Figure 4:
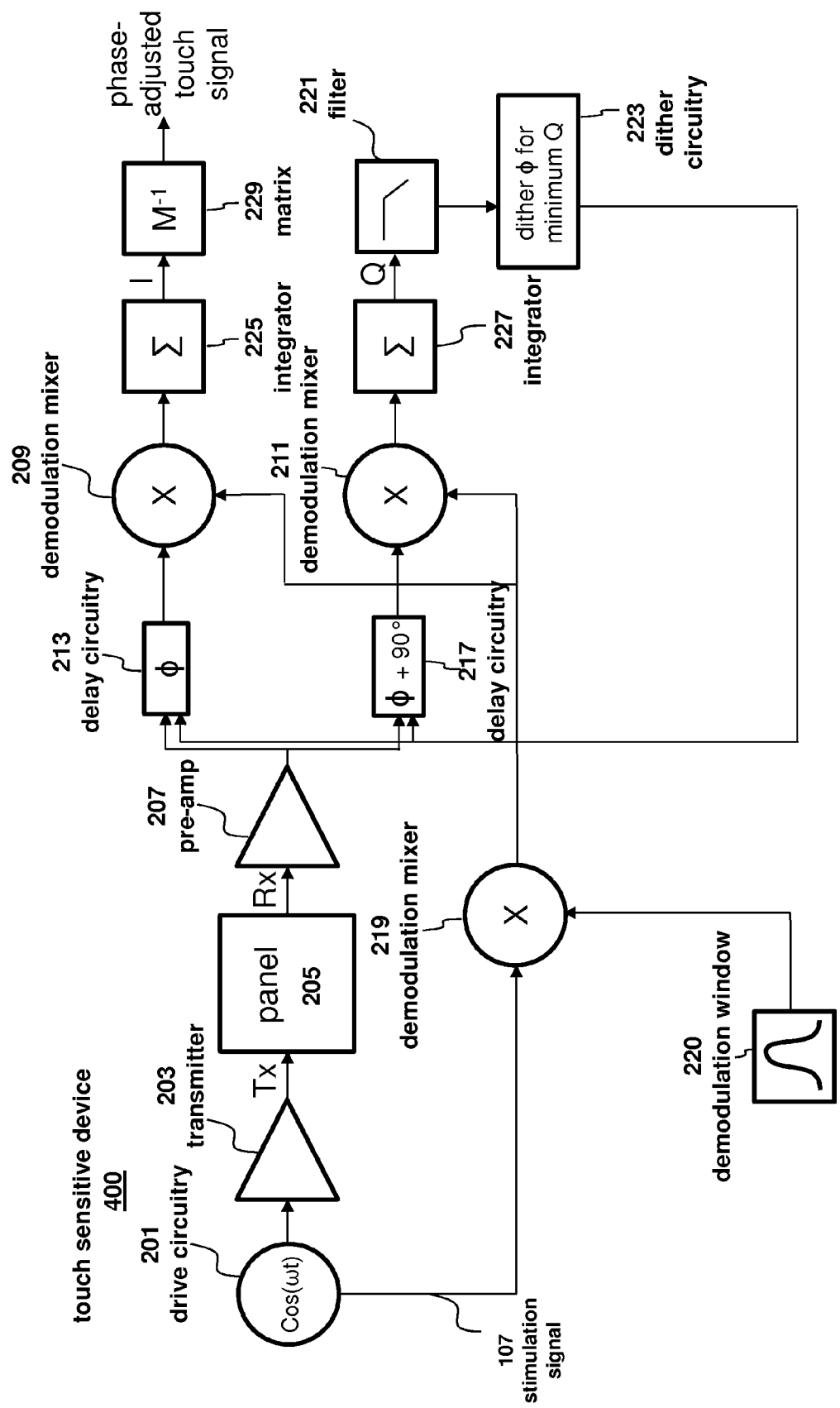
FIG. 4 illustrates a functional diagram of another exemplary demodulation circuit according to various embodiments.

FIG. 4 illustrates a functional diagram of an exemplary touch sensitive device 400 having a demodulation circuit. The demodulation circuit of device 400 is similar to that of device 200, except that delay circuitry 213 and 217 can be used to apply the phase delay φ and (φ+π90°) to the touch signal inputs of demodulation mixers 209 and 211, respectively. As a result, the demodulation circuit of device 400 may exclude demodulation mixer 215 and the output of demodulation mixer 219 can be applied to the inputs of both demodulation mixers 209 and 211.

Figure 5:
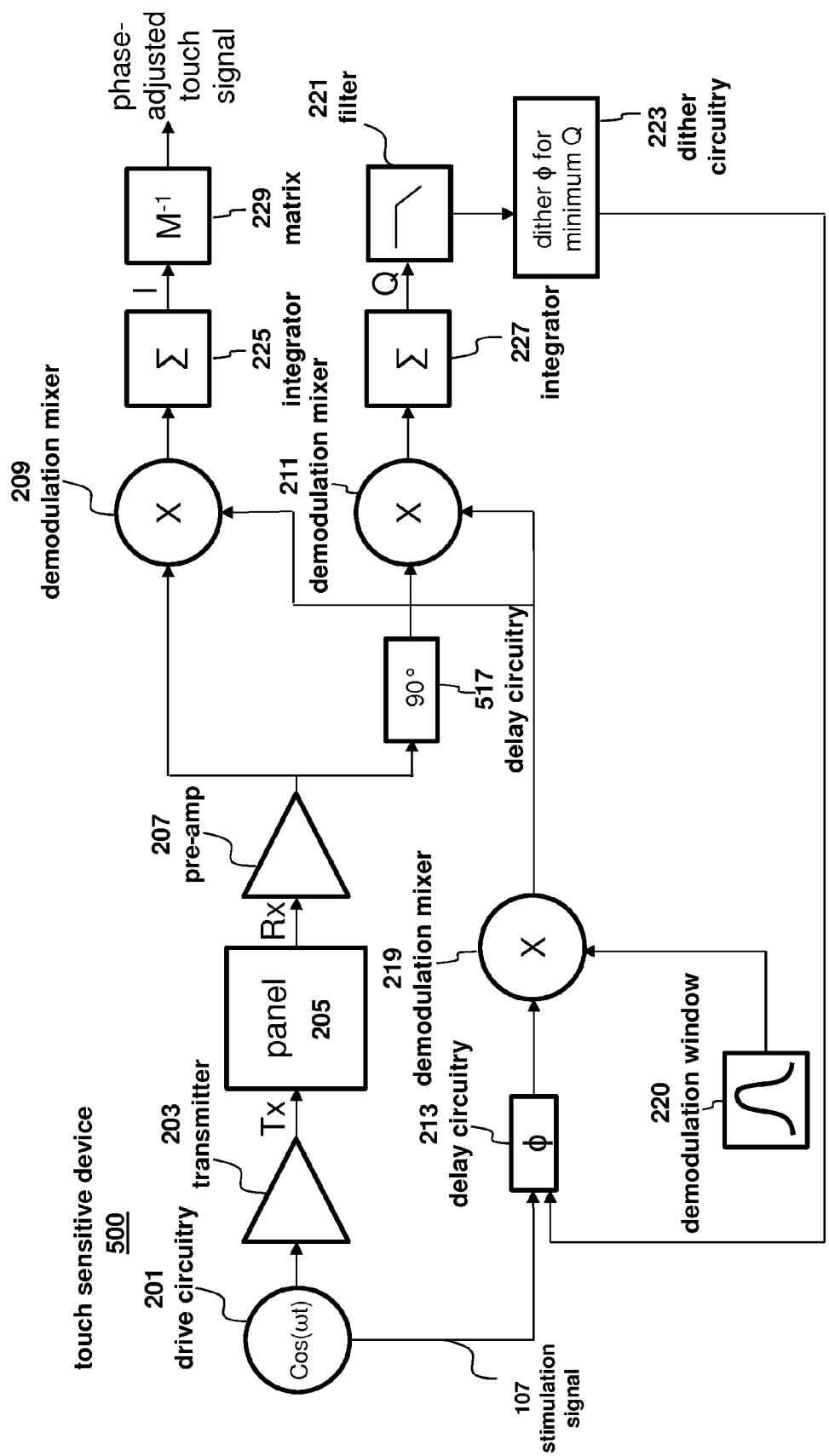
FIG. 5 illustrates a functional diagram of another exemplary demodulation circuit according to various embodiments.

FIG. 5 illustrates a functional diagram of an exemplary touch sensitive device 500 having a demodulation circuit. The demodulation circuit of device 500 is similar to that of device 400, except that delay circuitry 213 can be used to apply the phase delay φ to the stimulation signal output by drive circuitry 201. The phase delayed stimulation signal output by delay circuitry 213 can then be transmitted to demodulation mixer 219, where it can be combined with demodulation envelope window 220 and transmitted to both demodulation mixers 209 and 211. As a result, the demodulation circuit of device 500 can include delay circuitry 517 in place of delay circuitry 217 to introduce a 90° phase delay into the input of demodulation mixer 211.

Figure 6:
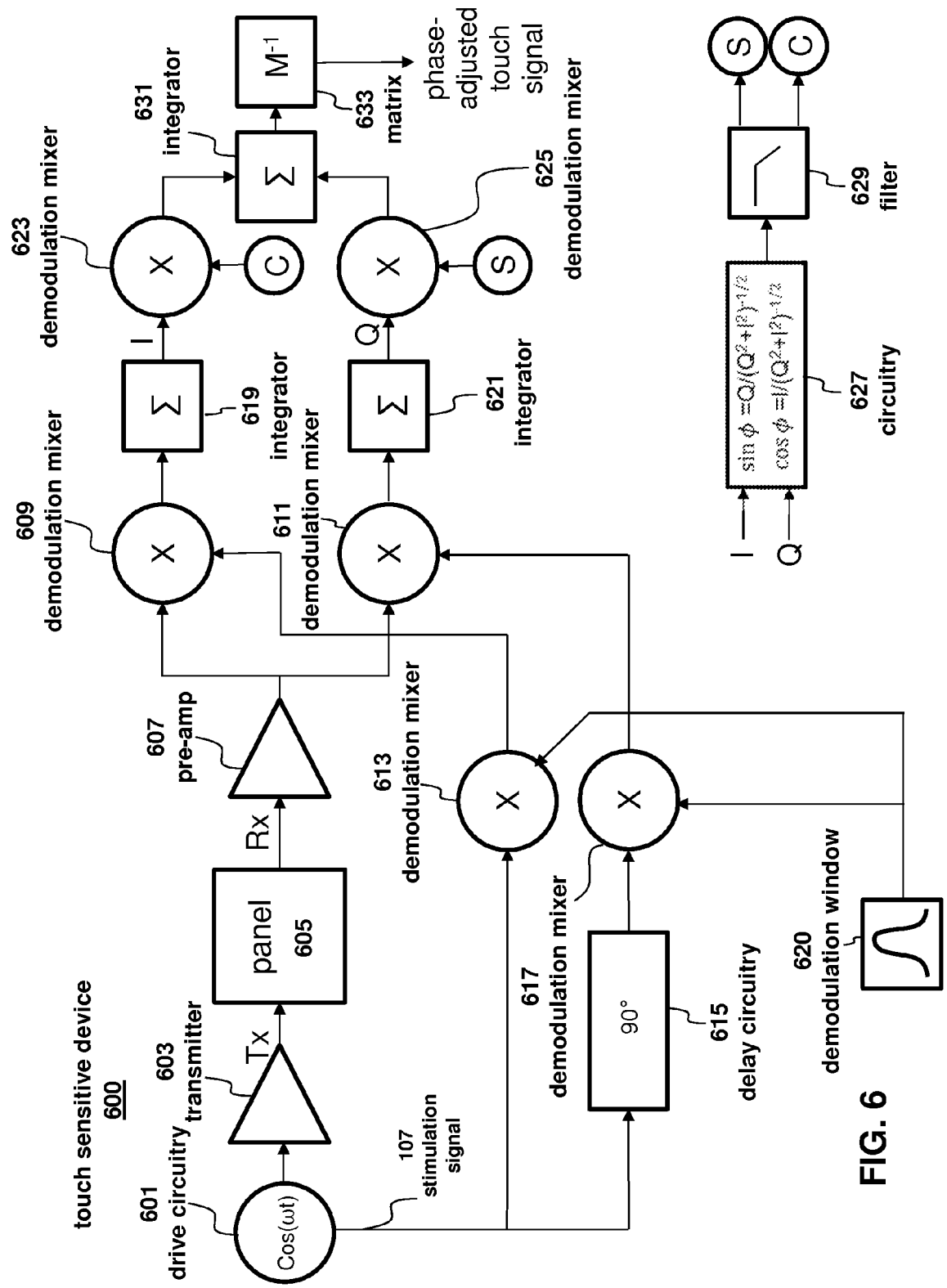
FIG. 6 illustrates a functional diagram of another exemplary demodulation circuit according to various embodiments.

FIG. 6 illustrates a functional diagram of an exemplary touch sensitive device 600 having a demodulation circuit. The similarly named components of device 600 can be similar or identical to those of device 200. Device 600 can include drive circuitry 601 for generating a stimulation signal, such as stimulation signal 107. The output of drive circuitry 601 can be transmitted to an input buffer, such as transmitter 603, before being sent to panel 605. Device 600 can also include panel 605, which can be a touch sensitive panel similar or identical to touch sensor panel 100. The touch signals output by panel 605 can represent touch events detected on panel 605. Touch panel 605 can output touch signals similar or identical to touch signals 109 in response to the stimulation signal. The output of panel 605 can be transmitted to an amplifier, such as pre-amp 607. The output of pre-amp 607 can be transmitted to demodulation mixers 609 and 611.

Device 600 can further include a demodulation circuit to determine an adjustable phase delay and to apply the adjustable phase delay to touch signals of the panel 605. The demodulation circuit can include demodulation mixer 613 configured to combine the stimulation signal from drive circuitry 601 and demodulation envelope window 620. Demodulation envelope window 620 can be a low or bandpass filter, such as a Chebyschev filter. The output of demodulation mixer 613 can be transmitted to demodulation mixer 609, where it can be combined with the touch signal output by pre-amp 607.

The demodulation circuit can further include delay circuitry 615 configured to receive the stimulation signal from drive circuitry 601 and cause a phase delay of 90° in the stimulation signal. The output of delay circuitry 615 can be transmitted to demodulation mixer 617 where it can be combined with demodulation envelope window 620. The output of demodulation mixer 617 can be transmitted to demodulation mixer 611, where it can be combined with the touch signal output by pre-amp 607.

The demodulation circuit can further include integrators 619 and 621 coupled to the outputs of demodulation mixers 609 and 611, respectively. Integrators 619 and 621 can integrate the output of demodulation mixers 609 and 611 over time. The output of integrator 619 can be the I-phase component of the touch signal output by pre-amp 607 and the output of integrator 621 can be the Q-component of the touch signal output by pre-amp 607.

The I-phase and Q-components output by integrators 619 and 621 can be transmitted to demodulation mixers 623 and 625, respectively. Demodulation mixers 623 and 625 can be configured to mix the I-phase and Q-components with cosine (C) and sine (S) phase adjustment signals generated by phase adjustment circuitry 627 and filtered by filter 629 (described in greater detail below). The phase-adjusted I-phase and Q-components of the touch signal output by demodulation mixers 623 and 625 can be transmitted to integrator 631, where the outputs can be combined. The output of integrator 631 can be transmitted to matrix 633 where the signal can be multiplied by a matrix to generate a phase-adjusted touch signal representing touch events detected by the sense line of panel 605 that is coupled to the demodulation circuit.

As mentioned above, the demodulation circuit can further include phase adjustment circuitry 627 for generating sine and cosine phase adjustment signals that can be modulated with the I-phase and Q-components of the touch signal output by integrators 619 and 621, respectively. Phase adjustment circuitry 627 can be configured to receive I-phase and Q-components output by integrators 619 and 621 and output a sine phase adjustment signal, where $\sin(\phi)=Q/(Q^2+I^2)^{-1/2}$, and a cosine phase adjustment signal, where $\cos(\phi)=I/(Q^2+I^2)^{-1/2}$. The sine and cosine phase adjustment signals can be transmitted to filter 629. In some embodiments, filter 629 can be a low pass filter with a bandwidth below 60 Hz. In other embodiments, other bandwidths can be used. The filtered sine (S) and cosine (C) phase adjustment signals can be transmitted to demodulation mixers 625 and 623, respectively. In this way, phase adjustment circuitry 627 can dynamically adjust the phase offset applied to the I-phase and Q-components of the touch signal output by panel 605 to compensate for phase delays caused by circuitry located between drive circuitry 601 and the outputs of integrators 619 and 621, thereby improving the signal strength of the touch signal output by matrix 633.

In some embodiments, phase adjustment circuitry 627 and filter 629 can be used to adjust the sine and cosine phase adjustment signals transmitted to demodulation mixers 623 and 625 only when no touch events are occurring at panel 605. In these embodiments, when touch events are occurring at panel 605, $\phi$ can be held constant at the most recently determined value of $\phi$.

In some embodiments, phase adjustment circuitry 627, filter 629, demodulation mixer 623, demodulation mixer 625, integrator 631, and matrix 633 can be implemented in an ARM processor or other processor since the functions performed by these elements do not need to be performed with a high frequency. The remaining components (excluding panel 605), can be implemented in an ASIC since the functions performed by these elements relate to the sensing of touch events on panel 605 and can be performed at a higher frequency. In some embodiments, the components located in the ASIC can be configured to scan the output of panel 605 and store the I-phase and Q-components. The components in the ARM processor can then perform decoding on the saved I-phase and Q-components after the ASIC performs the scanning. In other embodiments, phase adjustment circuitry 627 and filter 629 can be located in an ARM processor and the remaining components (excluding panel 605) can be located in an ASIC. In some embodiments, since demodulation mixers 623 and 625 can be used infrequently, demodulation mixers 623 and 625 can be shared with demodulation circuits for other sense lines (not shown) of panel 605. In still other embodiments, all components of device 600 (excluding panel 605) can be implemented in an ASIC.

Figure 7:
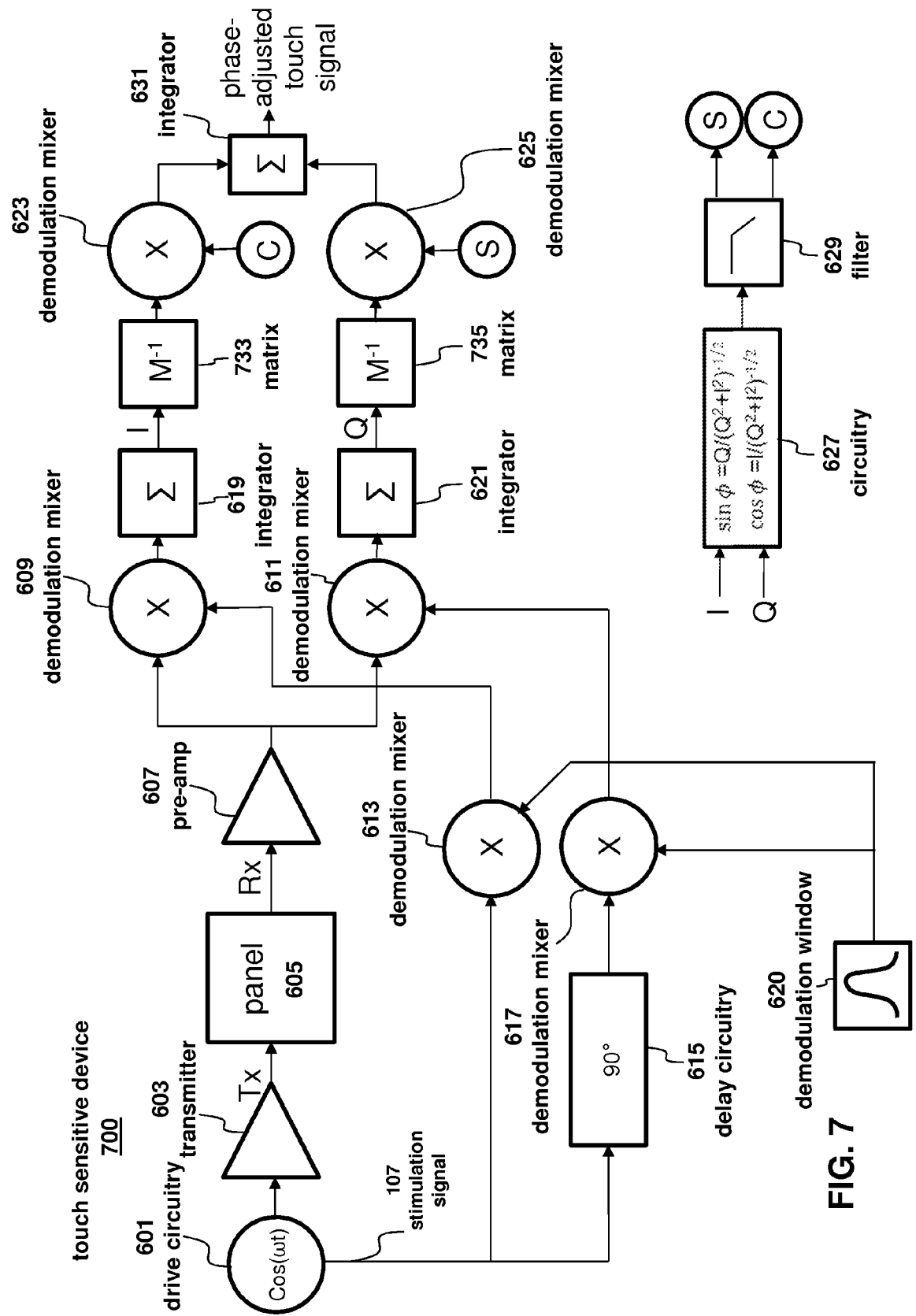
FIG. 7 illustrates a functional diagram of another exemplary demodulation circuit according to various embodiments.

FIG. 7 illustrates a functional diagram of an exemplary touch sensitive device 700 having a demodulation circuit. The demodulation circuit of device 700 is similar to that of device 600, except that the I-phase and Q-components of the touch signal can be multiplied with a matrix using matrices 733 and 735 before being transmitted to demodulation mixers 623 and 625, respectively. Matrices 733 and 735 can be similar or identical to matrix 633 of device 600. Since the I-phase and Q-components can be multiplied with a matrix using matrices 733 and 735 before being transmitted to demodulation mixers 623 and 625, device 700 may exclude matrix 633. As a result, the output of integrator 631 can be the phase-adjusted touch signal representative of touch events detected at panel 605. Additionally, similar to the demodulation circuit of device 600, phase adjustment circuitry 627 and filter 629 can be located in an ARM processor or other processor while the remaining components (excluding panel 605) can be located in an ASIC. Alternatively, all of the components (excluding panel 605) can be implemented on an ASIC.

Figure 8:
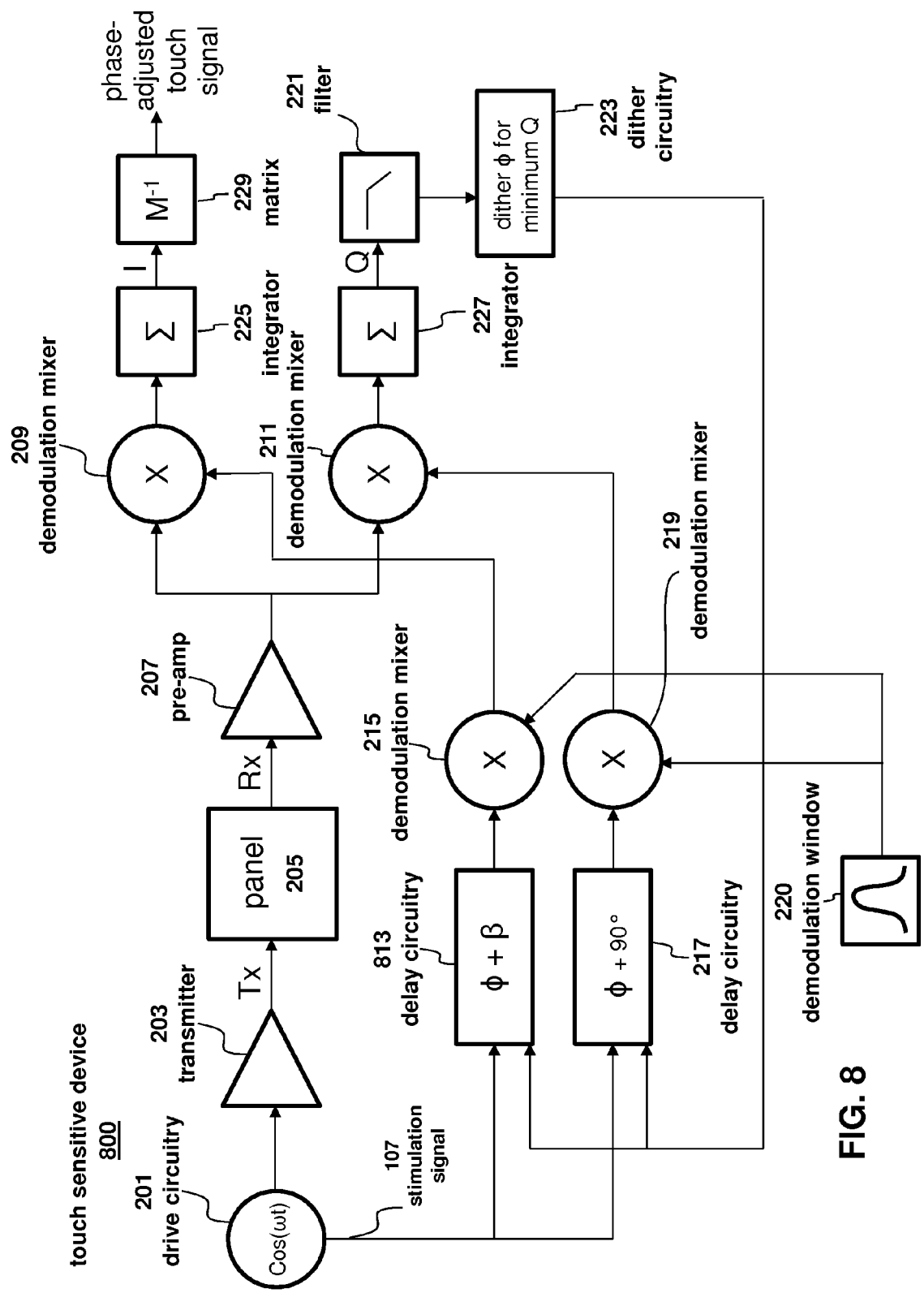
FIG. 8 illustrates a functional diagram of another exemplary demodulation circuit according to various embodiments.

FIG. 8 illustrates a functional diagram of an exemplary touch sensitive device 800 having a demodulation circuit. The demodulation circuit of device 800 is similar to that of device 200, except that an additional phase delay of β can be applied to the stimulation signal output by drive circuitry 201 and transmitted to demodulation mixer 209. Thus, delay circuitry 813, which can be configured to introduce a phase delay of $(\phi+\beta)$, can be used in place of delay circuitry 213 of the demodulation circuit of device 200. The phase delay β can represent a phase difference between a large, undesired signal in the touch signal output by panel 205 and a smaller, desired signal in the touch signal. The large, undesired signal can be generated by portions of the stimulation signal input of panel 205 traveling around the panel to the output. This can be a result of the manufacturing design of the panel. Thus, as long as remains relatively constant, the demodulation circuit of device 800 can be used to extract the smaller, desired signal from the output of the panel. In some embodiments, can be calculated or determined experimentally.

Figure 9:
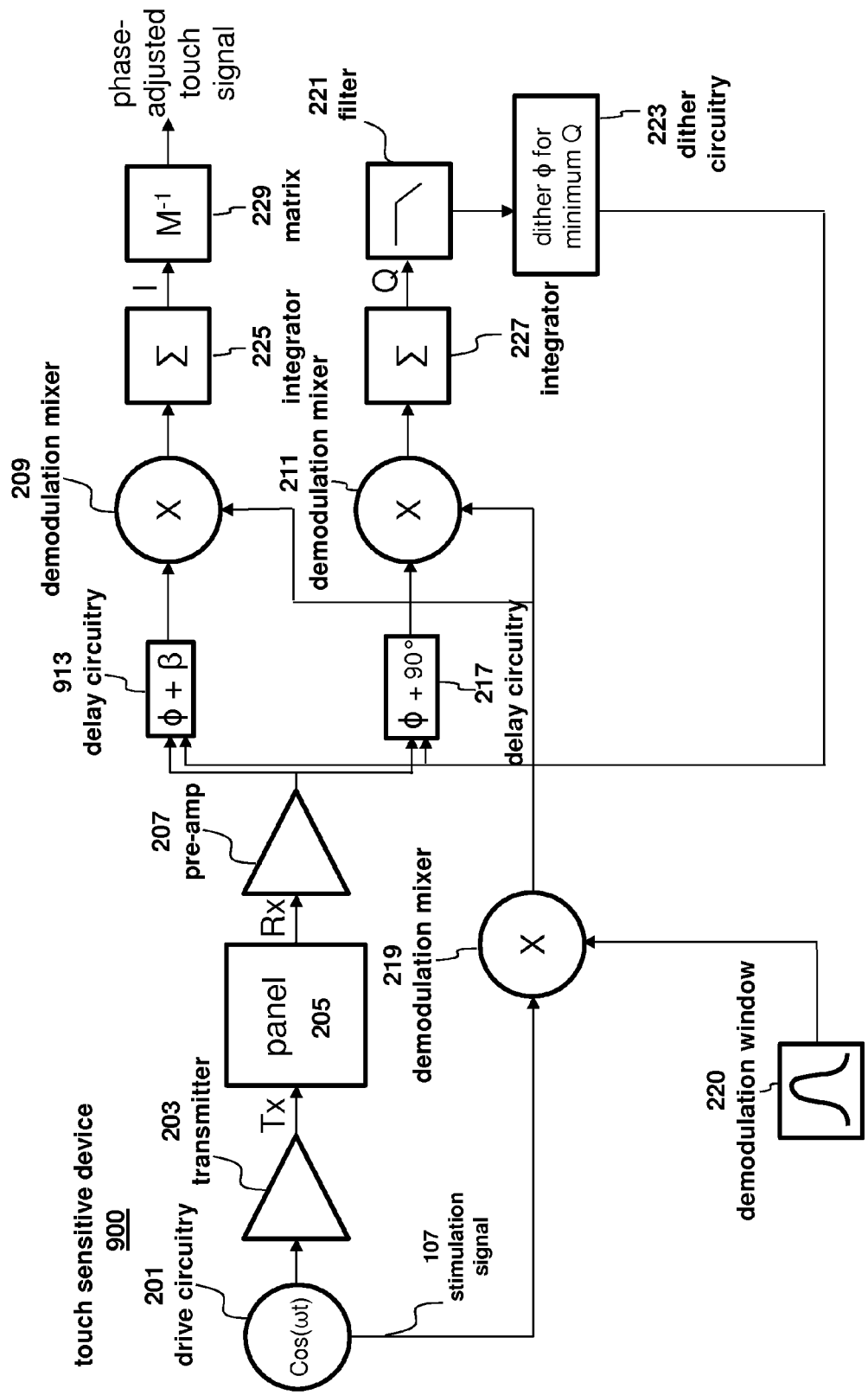
FIG. 9 illustrates a functional diagram of another exemplary demodulation circuit according to various embodiments.

FIG. 9 illustrates a functional diagram of an exemplary touch sensitive device 900 having a demodulation circuit. The demodulation circuit of device 900 is similar to that of device 400, except that an additional phase delay of β can be applied to the input of demodulation mixer 209. Thus, delay circuitry 913, which can be configured to introduce a phase delay of $(\phi+\beta)$, can be used in place of delay circuitry 213 of the demodulation circuit of device 400. Similar to the demodulation circuit of device 800, the phase delay β can represent a phase difference between a large, undesired signal in the output of panel 205 and a smaller, desired signal in the touch signal. The large, undesired signal can be generated by portions of the stimulation signal input of panel 205 traveling around the panel to the output. This can be a result of the manufacturing design of the panel. Thus, as long as remains relatively constant, demodulation circuit of device 900 can be used to extract the smaller, desired signal from the output of the panel. In some embodiments, can be calculated or determined experimentally.

Figure 10:
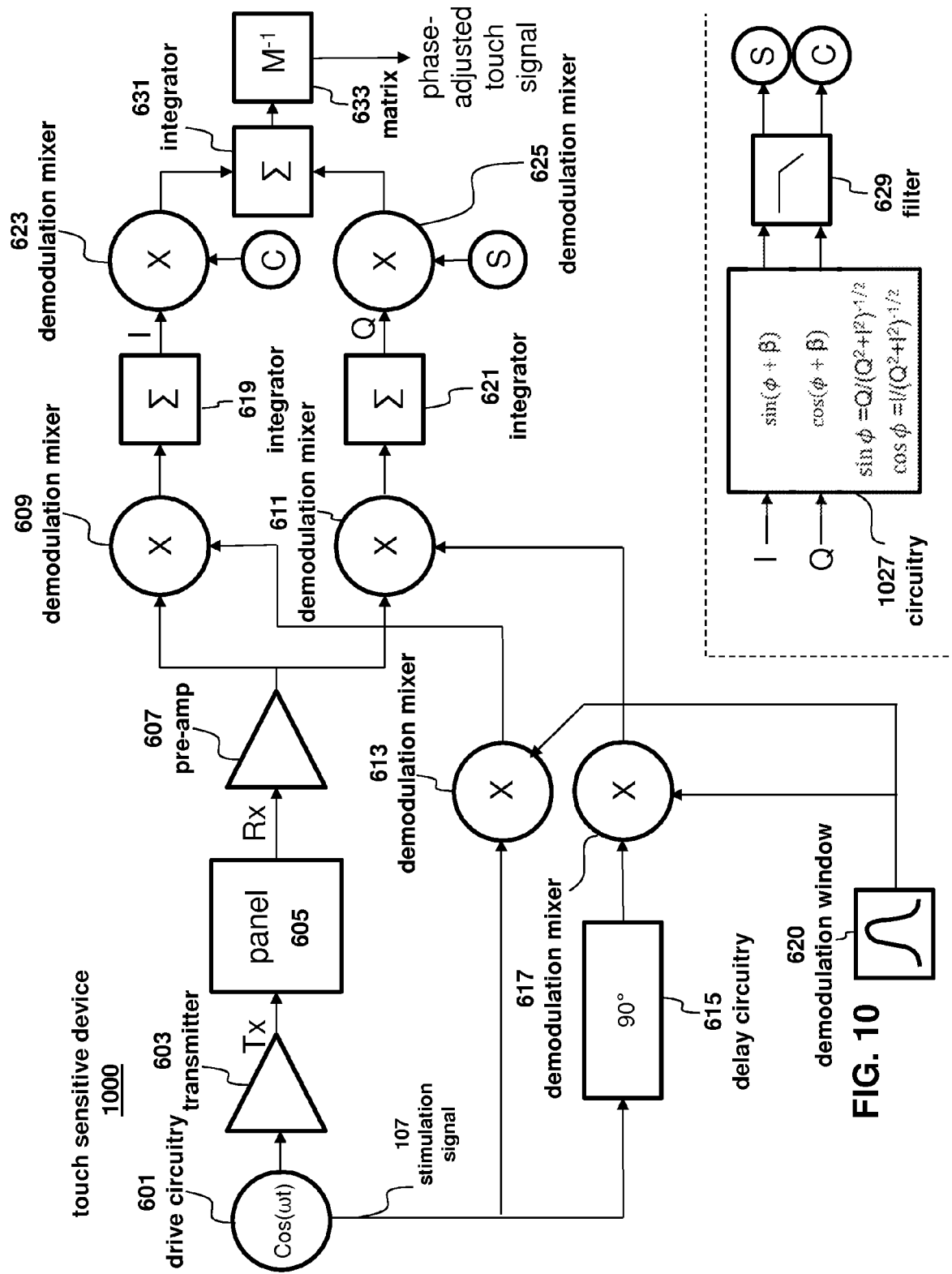
FIG. 10 illustrates a functional diagram of another exemplary demodulation circuit according to various embodiments.

FIG. 10 illustrates a functional diagram of an exemplary touch sensitive device 1000 having a demodulation circuit. The demodulation circuit of device 1000 is similar to that of device 600, except that an additional phase delay of β can be used when generating the sine and cosine phase adjustment signals that can be applied to demodulation mixers 623 and 625. Specifically, the filtered sine phase adjustment signal (S) can include signal $\sin(\phi+\beta)$, where $\sin(\phi)=Q/(Q^2+I^2)^{-1/2}$, and the filtered cosine phase adjustment signal can include signal $\cos(\phi+\beta)$, where $\cos(\phi)=I/(Q^2+I^2)^{-1/2}$. Thus, phase adjustment circuitry 1027 can be used in place of phase adjustment circuitry 627 of the demodulation circuit of device 600. Similar to the demodulation circuit of device 800, the phase delay β can represent a phase difference between a large, undesired signal in the output of panel 605 and a smaller, desired signal in the touch signal. The large, undesired signal can be generated by portions of the stimulation signal input of panel 605 traveling around the panel to the output. This can be a result of the manufacturing design of the panel. Thus, as long as β remains relatively constant, demodulation circuit of device 1000 can be used to extract the smaller, desired signal from the output of the panel. In some embodiments, β can be calculated or determined experimentally.

It should be appreciated that any of the demodulation circuits for devices 200, 300, 400, 500, 600, and 700 can be modified in a similar manner as the demodulation circuits of devices 800, 900, and 1000 to include the compensation for undesired signals.

In some embodiments, each sense line column (e.g., sense lines 103 of touch sensor panel 100) can be coupled to a demodulation circuit, such as any of the demodulation circuits shown in FIGS. 2-10. Additionally, for each sense line column, the coupled demodulation circuit can be configured to apply a different phase delay $\phi$ for each row (e.g., drive lines 101 of touch sensor panel 100). This can be done because the phase delay between each drive line row and sense line column can be different. For instance, the phase delay that results from a capacitive coupling between drive line D0 and sense line S0 can be different than a phase delay resulting from a capacitive coupling between drive line D2 and sense line S0. Thus, separate phase delays $\phi$ can be applied to each column-row pairing. In some embodiments, this can be accomplished by replicating some or all of the components in each demodulation circuit for each column. In this way, separate phase delays $\phi$ can be determined for each column-row pairing. For example, demodulation mixers 209 and 211, 215 and 219, 609 and 611, or 613 and 617 can be replicated for each row-channel pairing. In other embodiments, the same physical or logical components can be used for each row-channel pairing. In these embodiments, time-division multiplexing can be used to assign time slots for each row within the channel.

Figure 11:
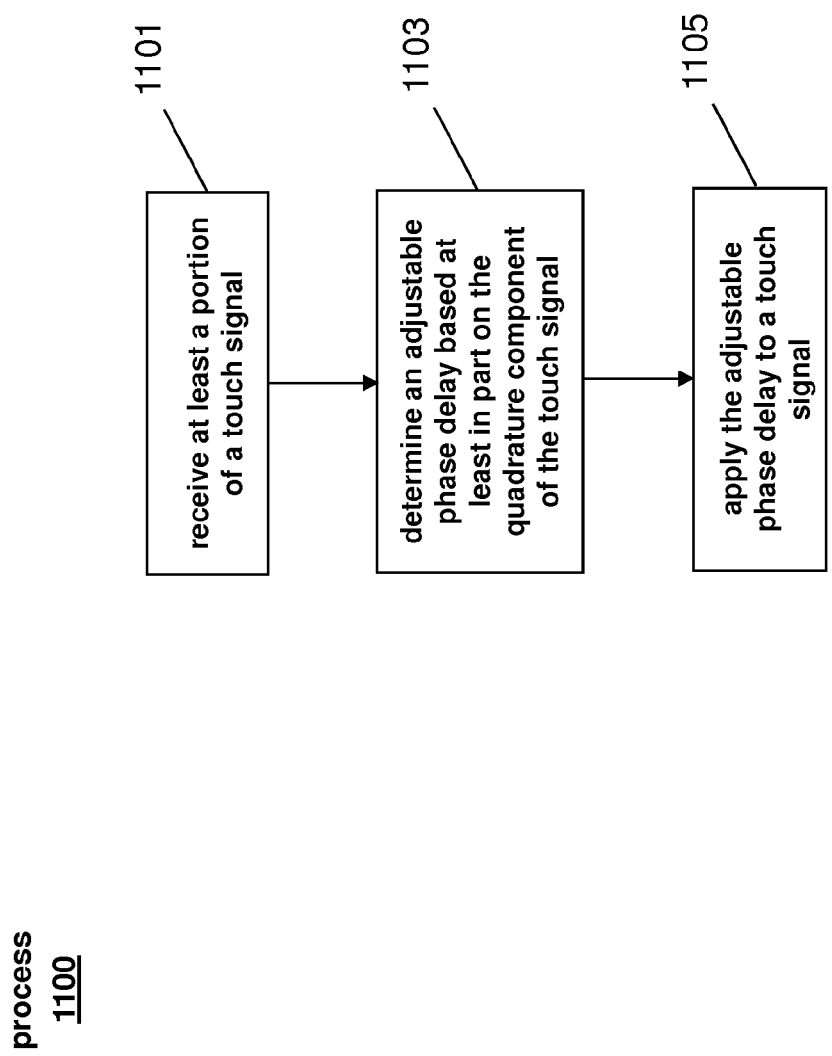
FIG. 11 illustrates an exemplary process for demodulating a signal according to various embodiments.

FIG. 11 shows an exemplary process 1100 for demodulating a touch signal. In some embodiments, process 1100 can be used to compensate for variable phase delays in a touch sensitive panel using a demodulation circuit that is similar or identical to demodulation circuits of devices 200, 300, 400, 500, 600, 700, 800, 900, or 1000.

At block 1101 of process 1100, at least a portion of a touch signal can be received. In some embodiments, a filter (e.g., filter 221) can receive the quadrature component of a phase-adjusted touch signal from an integrator (e.g., integrator 227). In other embodiments, phase adjustment circuitry (e.g., circuitry 627 or 1027) can receive the quadrature component of a non-phase-adjusted touch signal from an integrator (e.g., integrator 621). In these embodiments, the phase adjustment circuitry (e.g., circuitry 627 or 1027) can also receive the in-phase component of the non-phase-adjusted touch signal from an integrator (e.g., integrator 619).

At block 1103, an adjustable phase delay may be determined based at least in part on the quadrature component of the phase-adjusted or non-phase-adjusted touch signal. In some embodiments, as described above with respect to FIGS. 2-5 and 8-9, the adjustable phase delay $\phi$ can be determined by dithering the adjustable phase delay $\phi$ around an expected value (e.g., as determined through calculations or experimentation) until a reduced or minimum value of the quadrature component of the phase-adjusted touch signal is obtained. This determined adjustable phase delay $\phi$ can also correspond to the phase delay that causes the in-phase component of the phase-adjusted touch signal to be at its maximum value. One of ordinary skill in the art will be capable of implementing known techniques for dithering a phase delay $\phi$ until reaching a reduced or minimum value of the quadrature component of the phase-adjusted touch signal.

In other embodiments, as described above with respect to FIGS. 6-7 and 10, the adjustable phase delay $\phi$ can be determined using both the quadrature and in-phase components of the non-phase-adjusted touch signal and the following equations: $\sin(\phi)=Q/(Q^2+I^2)^{-1/2}$ and $\cos(\phi)=I/(Q^2+I^2)^{-1/2}$. The functions performed at block 1103 can be performed using an ASIC processor, ARM processor, other electrical components, or combinations thereof.

At block 1105, the adjustable phase delay $\phi$ determined at block 1103 can be applied to the touch signal. In some embodiments, as described above with respect to FIGS. 3 and 4, the phase delay $\phi$ can be applied to the touch signal by causing a phase delay of $\phi$ in the non-phase-adjusted touch signal. This can be done, for example, using delay circuitry, such as delay circuitry 213, 217, or 301.

In other embodiments, as described above with respect to FIGS. 2 and 5, the phase delay $\phi$ can be applied to the touch signal by causing a phase delay of $\phi$ in the stimulation signal, and mixing the phase-delayed stimulation signal with the non-phase adjusted touch signal. This can be done, for example, using delay circuitry, such as delay circuitry 213 and 217, and a mixer, such as demodulation mixer 209 and 211.

In yet other embodiments, as described above with respect to FIGS. 6-7, the phase delay $\phi$ can be applied to the touch signal by mixing the non-phase-adjusted touch signal with sine and cosine phase adjustment signals having phase delays of cp. This can be done, for example, using phase adjustment circuitry, such as phase adjustment circuitry 627, and mixers, such as demodulation mixers 623 and 625.

In yet other embodiments, as described above with respect to FIGS. 8-10, a phase delay of $\beta$ can be applied to the touch signal in addition to the phase delay of $\phi$. The phase delay $\beta$ can represent a phase difference between a large, undesired signal in the touch signal and a smaller, desired signal in the touch signal. The phase delay $\beta$ can be determined experimentally and configured into the demodulation circuit. In some embodiments, as described above with respect to FIG. 8, a phase delay of $(\phi+\beta)$ can be applied to the touch signal by causing a phase delay of $(\phi+\beta)$ in the stimulation signal, and mixing the phase-delayed stimulation signal with the non-phase-adjusted touch signal using delay circuitry, such as delay circuitry 813, and a mixer, such as demodulation mixer 209. In other embodiments, as described above with respect to FIG. 9, a phase delay of $(\phi+\beta)$ can be applied to the touch signal by causing a phase delay of $(\phi+\beta)$ in the non-phase-adjusted touch signal using delay circuitry, such as delay circuitry 913 of circuit 900. In yet other embodiments, as described above with respect to FIG. 10, a phase delay of $(\phi+\beta)$ can be applied to the touch signal by mixing the non-phase-adjusted touch signal with sine and cosine phase adjustment signals having phase delays of $(\phi+\beta)$. This can be done, for example, using phase adjustment circuitry, such as phase adjustment circuitry 1027, and mixers, such as demodulation mixers 623 and 625.

Figure 12:
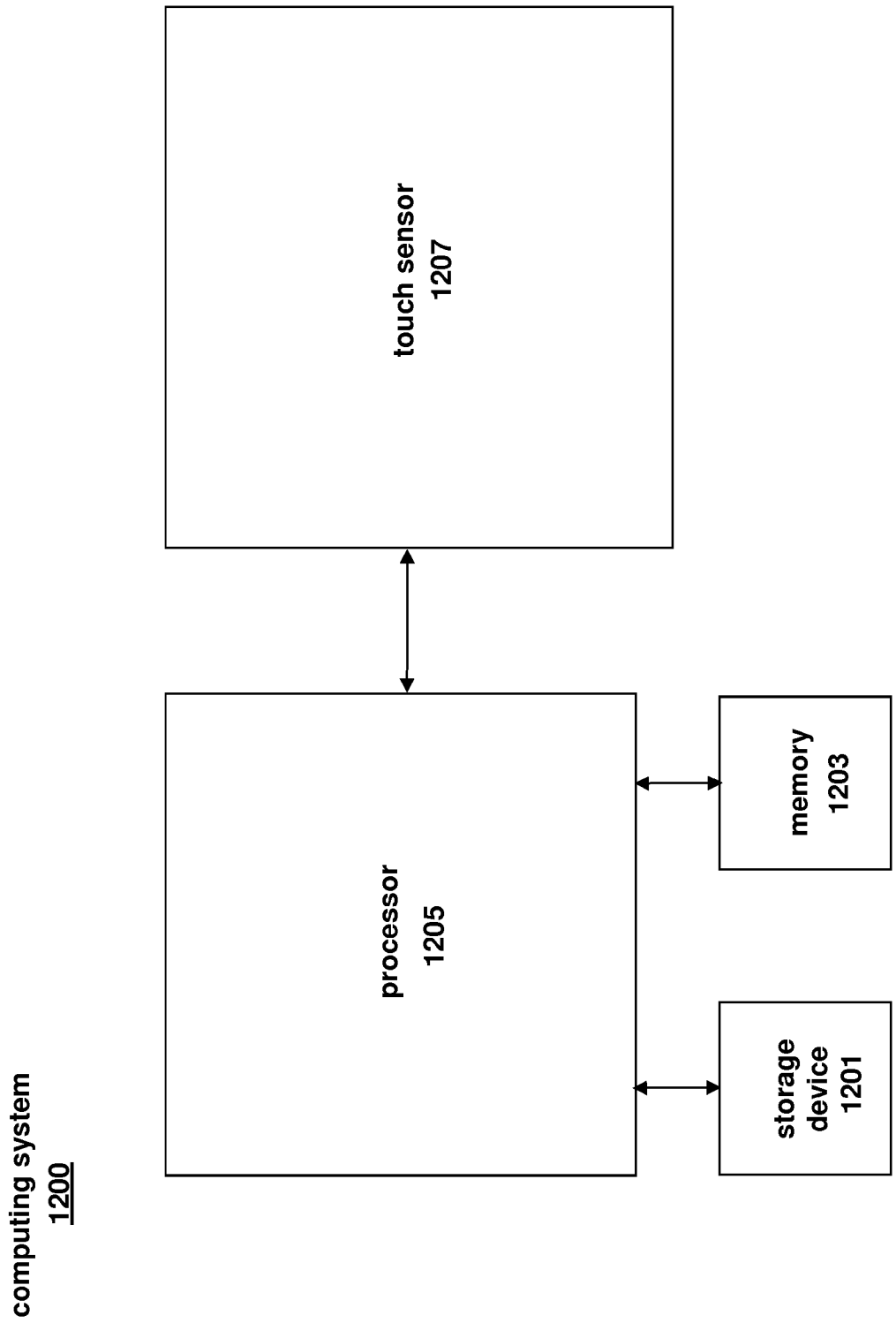
FIG. 12 illustrates an exemplary computing system for demodulating a signal according to various embodiments.

One or more of the functions relating to the demodulation of a touch signal can be performed by a computing system similar or identical to computing system 1200 shown in FIG. 12. Computing system 1200 can include instructions stored in a non-transitory computer readable storage medium, such as memory 1203 or storage device 1201, and executed by processor 1205. The instructions can also be stored and/or transported within any non-transitory computer readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer readable storage medium" can be any medium that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The instructions can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Computing system 1200 can further include touch sensor 1207 coupled to processor 1205. Touch sensor 1207 can be included within a touch panel and can be similar or identical to touch sensor panel 100, described above. In some embodiments, additional circuitry (not shown), such as the components of the demodulation circuits of devices 200, 300, 400, 500, 600, 700, 800, 900, or 1000 can also be included within computing system 1200. These components can be coupled to processor 1205 and/or touch sensor 1207, or can be integrated with either or both of processor 1205 and touch sensor 1207. In some embodiments, processor 1205 can receive the touch signals from touch sensor 1207 and can demodulate them in a manner similar or identical to that described above with respect to process 1100.

It is to be understood that the computing system is not limited to the components and configuration of FIG. 12, but can include other or additional components in multiple configurations according to various embodiments. Additionally, the components of computing system 1200 can be included within a single device, or can be distributed between two or more devices.

Figure 13:
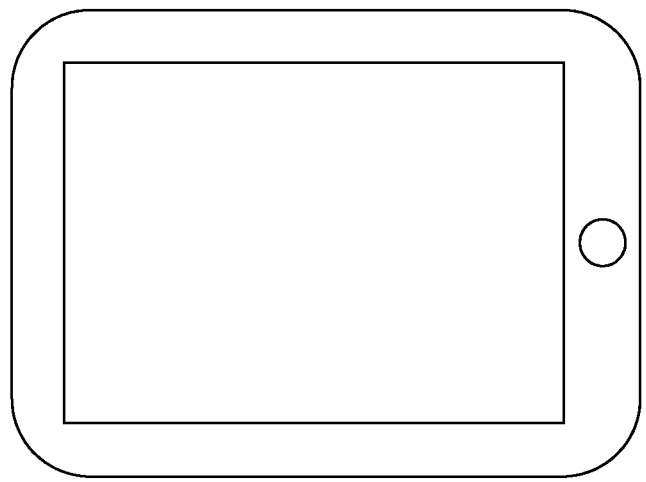
FIG. 13 illustrates an exemplary personal device having a demodulation circuit according to various embodiments.

FIG. 13 illustrates an exemplary personal device 1300, such as a tablet, that can include a demodulation circuit according to various embodiments.

Figure 14:
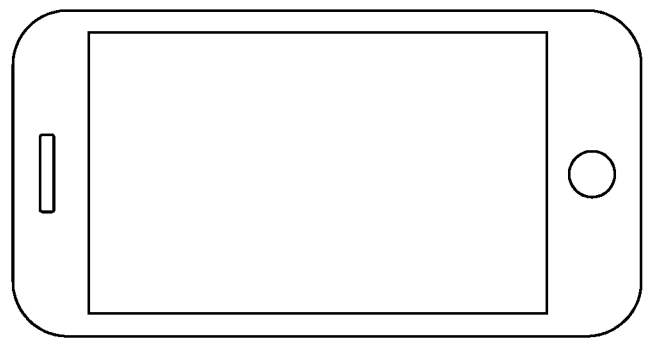
FIG. 14 illustrates an exemplary personal device having a demodulation circuit according to various embodiments.

FIG. 14 illustrates another exemplary personal device 1400, such as a mobile phone, that can include a demodulation circuit according to various embodiments.

Figure 15:
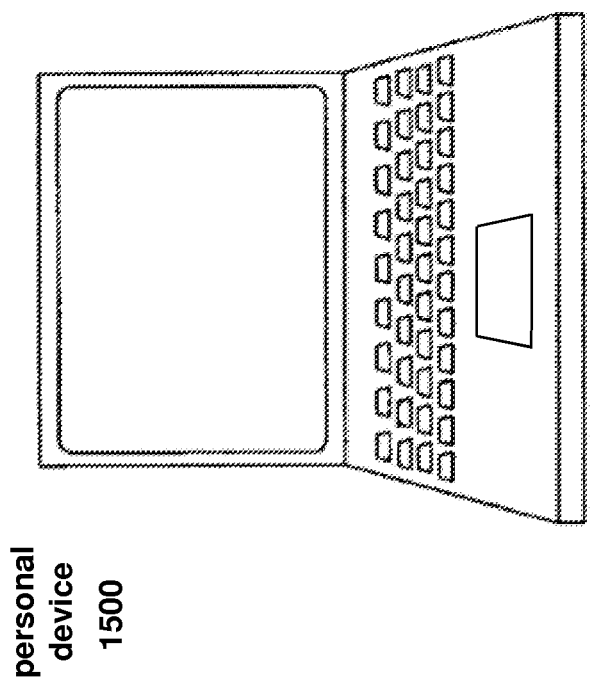
FIG. 15 illustrates an exemplary personal device having a demodulation circuit according to various embodiments.

FIG. 15 illustrates another exemplary personal device 1500, such as a laptop computer, that can include a demodulation circuit according to various embodiments.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A demodulation circuit configured to:
   determine an adjustable phase delay to be applied to a touch signal from a touch panel, the adjustable phase delay determined based at least in part on a phase-adjusted quadrature (Q) component of the touch signal; and
   apply the adjustable phase delay to the touch signal to generate the phase-adjusted Q component of the touch signal.

2. The demodulation circuit of claim 1 further comprising:
   a first integrator configured to output a phase-adjusted in-phase (I-phase) component of the touch signal; and
   a second integrator configured to output the phase-adjusted Q-component of the touch signal.

3. The demodulation circuit of claim 2 further comprising:
   a matrix circuit configured to multiply the phase-adjusted I-phase component of the touch signal by a matrix to generate a phase-adjusted touch signal representing a touch event on the touch panel.

4. The demodulation circuit of claim 1 further comprising:
   a filter configured to filter the phase-adjusted quadrature (Q) component of the touch signal; and
   a dither circuit coupled to an output of the filter, wherein the dither circuit is configured to dither the adjustable phase delay to determine a value of the adjustable phase delay corresponding to a minimum value of the phase-adjusted Q-component of the touch signal.

5. The demodulation circuit of claim 1, wherein the demodulation circuit is located within a touch-sensitive device, and wherein the touch-sensitive device comprises:
   a touch panel comprising:
      a plurality of drive lines, wherein a drive line of the plurality of drive lines is configured to receive a stimulation signal; and
      a plurality of sense lines, wherein a sense line of the plurality of sense lines is configured to transmit the touch signal in response to the stimulation signal;
   wherein the demodulation circuit is coupled to the sense line.

6. The demodulation circuit of claim 5, wherein the touch-sensitive device further comprises additional demodulation circuits coupled to each of the plurality of sense lines.

7. A demodulation circuit comprising:
   a phase adjustment circuit configured to generate a first phase adjustment signal and a second phase adjustment signal, the first and second phase adjustment signals generated based at least in part on a quadrature (Q) component of a touch signal and an in-phase (I-phase) component of the touch signal; and
   a mixing circuit configured to mix the I-phase component of the touch signal with the first phase adjustment signal and the Q-phase component of the touch signal with the second phase adjustment signal.

8. The demodulation circuit of claim 7, wherein the first phase adjustment signal is 90° out of phase with the second phase adjustment signal.

9. The demodulation circuit of claim 7, wherein the mixing circuit comprises:
   a first demodulation mixer configured to mix the I-phase component of the touch signal with the first phase adjustment signal; and
   a second demodulation mixer configured to mix the Q component of the touch signal with the second phase adjustment signal.

10. The demodulation circuit of claim 7, wherein the phase adjustment circuit is further configured to determine an adjustable phase delay based at least in part on the Q component of the touch signal and the I-phase component of the touch signal.

11. The demodulation circuit of claim 7, wherein the demodulation circuit further comprises a filter configured to filter the first and second phase adjustment signals.

12. A touch-sensitive device comprising:
   a touch panel configured to receive a stimulation signal to drive the touch panel and to transmit a touch signal in response to the stimulation signal; and
   a demodulation circuit comprising:
      a filter configured to filter a phase-adjusted quadrature (Q) component of a touch signal generated by the touch panel; and a dither circuit coupled to an output of the filter, wherein the dither circuit is configured to dither an adjustable phase delay to determine a value of the adjustable phase delay corresponding to a minimum value of the phase-adjusted Q-component of the touch signal.

13. The touch-sensitive device of claim 12, wherein the filter is a low-pass filter having a bandwidth below 60 Hz.

14. The touch-sensitive device of claim 12, wherein the filter and the dither circuit are integrated within a processor.

15. The touch-sensitive device of claim 12, wherein the dither circuit is configured to dither the adjustable phase delay during periods of time when no touch events are occurring on the touch panel.

16. The touch-sensitive device of claim 12, wherein the dither circuit is configured to maintain the value of the adjustable phase delay during periods of time when touch events are occurring on the touch panel.

17. A method for adjusting a phase delay of a touch signal from a touch panel, the method comprising:
receiving a touch signal from a touch panel;
generating a first phase adjustment signal and a second phase adjustment signal, wherein the first and second phase adjustment signals are generated based at least in part on an in-phase (I-phase) component of the touch signal and a quadrature (Q) component of the touch signal;
applying the first phase adjustment signal to the I-phase component of the touch signal to generate a phase-adjusted I-phase component of the touch signal; and
applying the second phase adjustment signal to the Q component of the touch signal to generate a phase-adjusted Q component of the touch signal.

18. The method of claim 17, wherein applying the first phase adjustment signal to the I-phase component of the touch signal comprising mixing the first phase adjustment signal with the I-phase component of the touch signal, and wherein applying the second phase adjustment signal to the Q component of the touch signal comprising mixing the second phase adjustment signal with the Q component of the touch signal.

19. The method of claim 17 further comprising:
integrating the phase-adjusted I-phase component of the touch signal with the phase-adjusted Q component of the touch signal to generate an integrated phase-adjusted touch signal; and
multiplying the integrated phase-adjusted touch signal with a matrix to generate a phase-adjusted touch signal that is representative of a proximity of an object to the touch panel.

20. The method of claim 17 further comprising:
prior to applying the first phase adjustment signal to the I-phase component of the touch signal, multiplying the I-phase component of the touch signal by a first matrix;
prior to applying the second phase adjustment signal to the Q component of the touch signal, multiplying the Q component of the touch signal by a second matrix; and
integrating the phase-adjusted I-phase component of the touch signal with the phase-adjusted Q component of the touch signal to generate a phase-adjusted touch signal that is representative of a proximity of an object to the touch panel.

21. A method for adjusting a phase delay of a touch signal from a touch panel, the method comprising:
receiving a touch signal from a touch panel;
determining an adjustable phase delay based at least in part on a phase-adjusted quadrature (Q) component of a touch signal; and
applying the adjustable phase delay to the touch signal to generate the phase-adjusted Q component of the touch signal.

22. The method of claim 21, wherein the applying the adjustable phase delay to the touch signal comprises causing a phase delay in the touch signal equal to the adjustable phase delay.

23. The method of claim 21, wherein the touch signal is generated by the touch panel in response to a stimulation signal, and wherein the applying the adjustable phase delay to the touch signal comprises:
causing a phase delay in the stimulation signal equal to the adjustable phase delay; and
mixing the phase-delayed stimulation signal with the touch signal.

24. The method of claim 21 further comprising multiplying a phase-adjusted in-phase (I-phase) component of the touch signal by a matrix to generate a phase-adjusted touch signal that is representative of a proximity of an object to the touch panel.

25. The method of claim 21 further comprising applying a constant phase delay to the touch signal, wherein the constant phase delay represents a phase difference between a desired component of the touch signal and an undesired component of the touch signal.

* * * * *